United States Patent
Mai et al.

(10) Patent No.: US 10,199,250 B2
(45) Date of Patent: Feb. 5, 2019

(54) SUBSTRATE PROCESSING DEVICE

(71) Applicant: MEYER BURGER (GERMANY) GMBH, Hohenstein-Ernstthal (DE)

(72) Inventors: Joachim Mai, Nobitz (DE); Mirko Kehr, Amtsberg (DE)

(73) Assignee: Meyer Burger (Germany) GmbH, Hohenstein-Ernstthal (DE)

( * ) Notice: Subject to any disclaimer, the term of this patent is extended or adjusted under 35 U.S.C. 154(b) by 24 days.

(21) Appl. No.: 14/376,913

(22) PCT Filed: Jan. 17, 2013

(86) PCT No.: PCT/IB2013/050414
§ 371 (c)(1),
(2) Date: Aug. 6, 2014

(87) PCT Pub. No.: WO2013/118003
PCT Pub. Date: Aug. 15, 2013

(65) Prior Publication Data
US 2014/0369791 A1    Dec. 18, 2014

(30) Foreign Application Priority Data
Feb. 6, 2012   (DE) .................. 10 2012 100 929

(51) Int. Cl.
*H01L 21/677* (2006.01)
*H01L 21/67* (2006.01)

(52) U.S. Cl.
CPC .. *H01L 21/67754* (2013.01); *H01L 21/67196* (2013.01); *H01L 21/67718* (2013.01); *H01L 21/67778* (2013.01)

(58) Field of Classification Search
CPC .............. H01L 21/67161; H01L 21/67754
See application file for complete search history.

(56) References Cited

U.S. PATENT DOCUMENTS

| 5,788,448 | A | 8/1998 | Wakamori et al. |
| 6,308,818 | B1 * | 10/2001 | Bonora ............. B65G 19/02 198/414 |
| 6,630,053 | B2 | 10/2003 | Yamagishi et al. |
| 7,367,135 | B2 | 5/2008 | Kato et al. |

(Continued)

FOREIGN PATENT DOCUMENTS

| DE | 69128861 T2 | 10/1998 |
| DE | 601313511 T2 | 10/2008 |

(Continued)

*Primary Examiner* — James Keenan
(74) *Attorney, Agent, or Firm* — Laurence A. Greenberg; Werner H. Stemer; Ralph E. Locher

(57) ABSTRACT

A substrate processing device contains a substrate loading/unloading area for loading/unloading of substrates. The substrate processing device further has a process chamber, a carrier device with which the substrates are transported by a carrier transport device to the process chamber, and a gas-tight closing device between the process chamber and the carrier transport area as well as a gas-tight closing device between the substrate loading/unloading area and the carrier transport area. The substrate processing device allows substrate processing at a high quality with high process purity, thereby being suitable for mass production. The object is achieved by the substrate loading/unloading area being coupled with the carrier transport area by a substrate transfer area with a substrate transfer device for transferring the substrates from a substrate cassette provided in the substrate loading/unloading area and in which substrates can be arranged in different horizontal cassette levels of the substrate cassette.

23 Claims, 16 Drawing Sheets

(56) References Cited

U.S. PATENT DOCUMENTS

| | | | |
|---|---|---|---|
| 7,658,969 | B2 | 2/2010 | Kumar et al. |
| 8,197,177 | B2 * | 6/2012 | van der Meulen .... B65G 25/02 |
| | | | 414/805 |
| 8,309,374 | B2 * | 11/2012 | Porthouse ......... H01L 21/67069 |
| | | | 414/217 |
| 8,444,364 | B2 * | 5/2013 | Blonigan ........... C23C 16/45565 |
| | | | 414/221 |
| 8,998,552 | B2 | 4/2015 | Toshima et al. |
| 2002/0127852 | A1 | 9/2002 | Kawakami et al. |
| 2005/0005849 | A1 * | 1/2005 | Masuoka ................. C23C 16/54 |
| | | | 118/719 |
| 2010/0226736 | A1 * | 9/2010 | Borden ................. C23C 14/566 |
| | | | 414/217 |
| 2011/0245957 | A1 | 10/2011 | Porthouse et al. |
| 2011/0278205 | A1 | 11/2011 | Endo |
| 2011/0313565 | A1 | 12/2011 | Yoo et al. |
| 2012/0136476 | A1 | 5/2012 | Baccini et al. |
| 2013/0108406 | A1 * | 5/2013 | Schaller ................. B65G 49/00 |
| | | | 414/744.3 |

FOREIGN PATENT DOCUMENTS

| | | | |
|---|---|---|---|
| DE | 102010016512 | A1 | 10/2011 |
| DE | 102010017497 | A1 | 12/2011 |
| EP | 1749901 | A2 | 2/2007 |
| JP | H04154145 | A | 5/1992 |
| JP | H0731539 | Y2 | 7/1995 |
| JP | H08213446 | A | 8/1996 |
| JP | 2001135704 | A | 5/2001 |
| JP | 2002141398 | A | 5/2002 |
| JP | 2002261146 | A | 9/2002 |
| JP | 2002332570 | A | 11/2002 |
| JP | 2003142393 | A | 5/2003 |
| JP | 2003179120 | A | 6/2003 |
| JP | 2004018215 | A | 1/2004 |
| JP | 2004288720 | A | 10/2004 |
| JP | 2005142200 | A | 6/2005 |
| JP | 2006073654 | A | 3/2006 |
| JP | 2009120937 | A | 6/2009 |
| JP | 2009200241 | A | 9/2009 |
| JP | 2010109089 | A | 5/2010 |
| JP | 2011100895 | A | 5/2011 |
| TW | 200403351 | A | 3/2004 |
| TW | 201104910 | A | 2/2011 |
| TW | 201117934 | A | 6/2011 |
| WO | 03100848 | A1 | 12/2003 |
| WO | 2011003484 | A1 | 1/2011 |
| WO | 2011055482 | A1 | 5/2011 |
| WO | 2011148924 | A1 | 12/2011 |

* cited by examiner

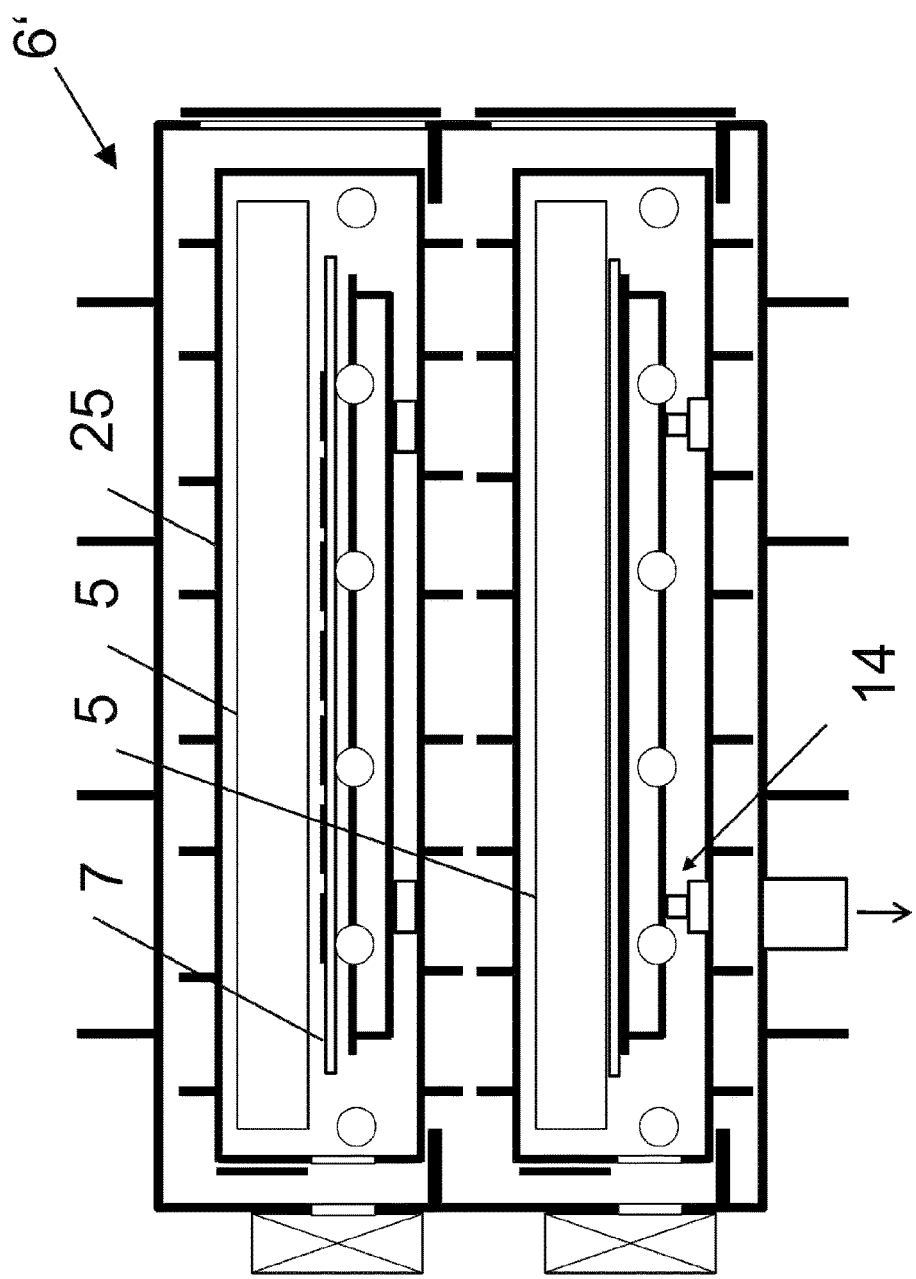

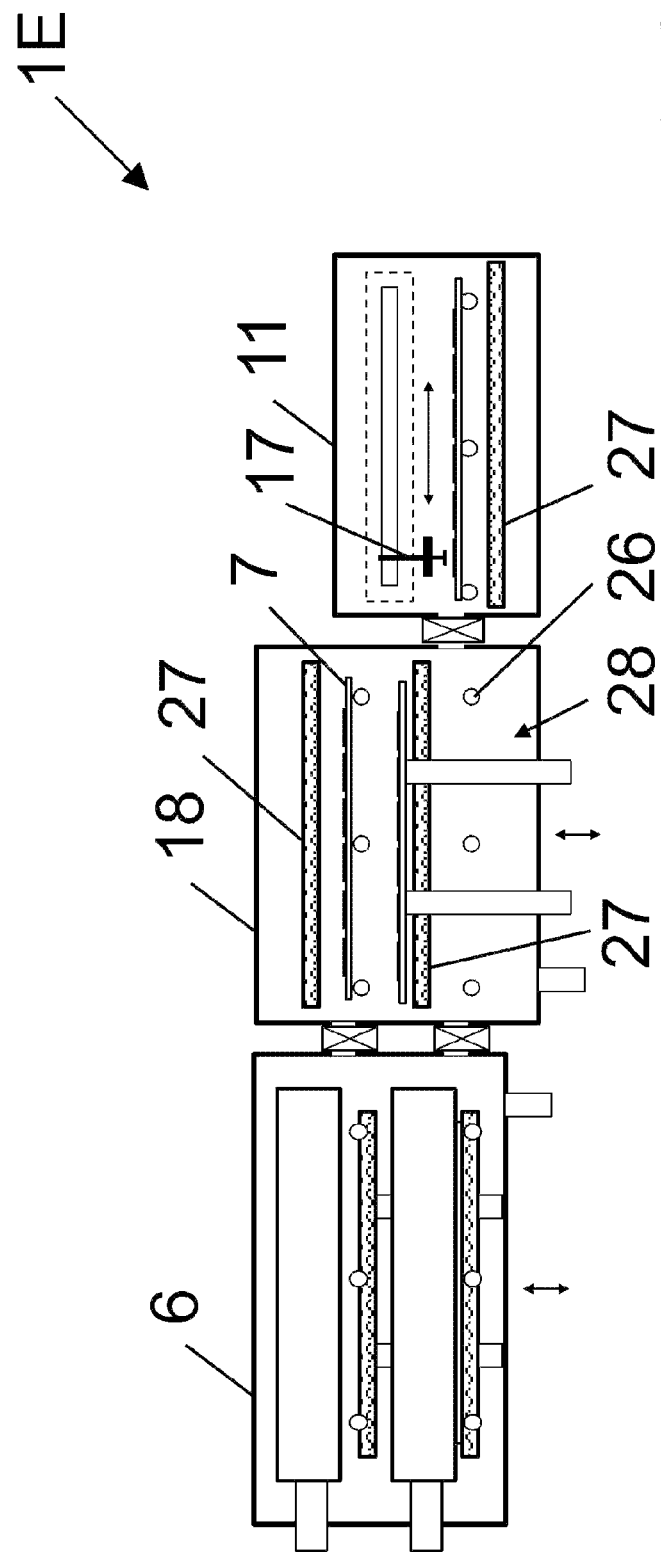

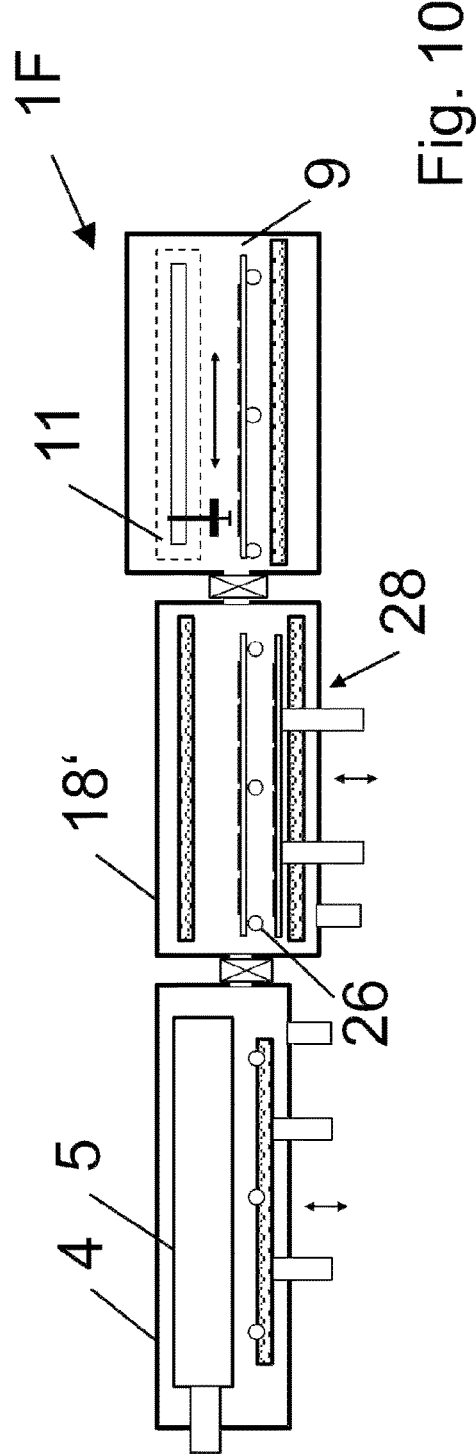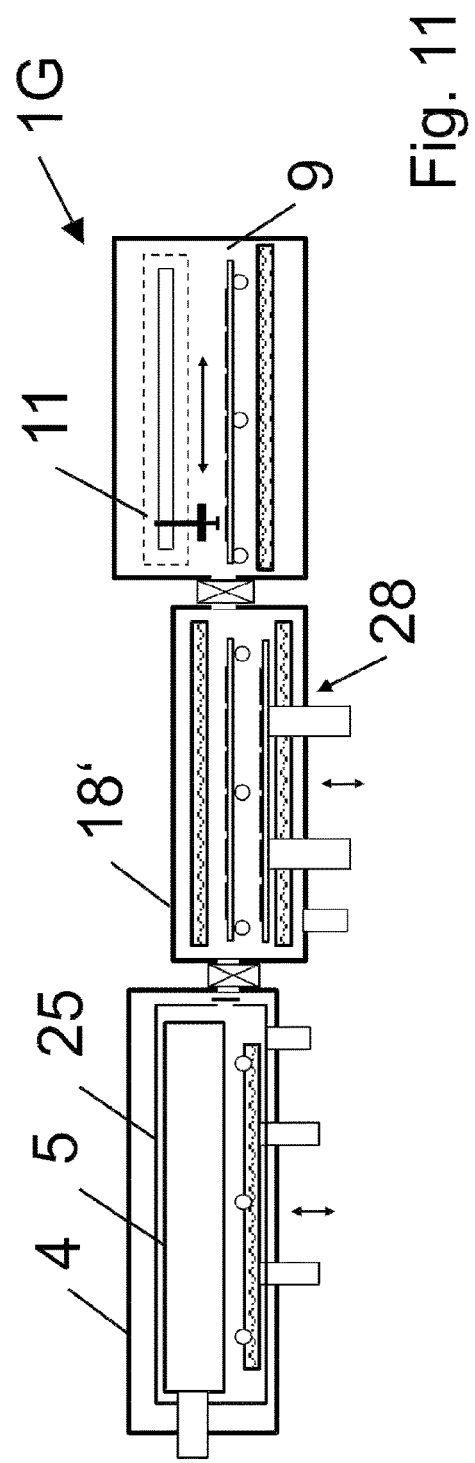

SUBSTRATE PROCESSING DEVICE

BACKGROUND OF THE INVENTION

Field of the Invention

The present invention relates to a substrate processing device, which comprises at least one substrate loading and unloading area for the loading and unloading of the substrate processing device with at least one substrate, at least one evacuable process chamber, at least one carrier device, with which the at least one substrate is transportable by means of at least one carrier transport device in at least one carrier transport area to the at least one process chamber, and at least one gas-tight closing device between the at least one process chamber and the carrier transport area as well as at least one gas-tight closing device between the substrate loading and unloading area and the carrier transport area.

In prior art, in-line coating devices are known which are used for mass production of solar cells, for instance. For coating, several, for example 42, solar cell wafers are placed on a carrier device in one level and are coated in an in-line device during a continuous process through this device. Thereby, single processing regions are insulated from each other by gas curtains, for instance. The development in the solar cell technology leads frequently to increased demands on the technology of the devices, for instance, regarding the process purity in the substrate processing devices. It is problematic to meet these increasing demands with common in-line devices.

Different types of substrate processing devices are also known in the state of art meeting increased demands on purity. One type of such substrate processing devices is a vertical batch oven, known from the microelectronic industry. A boat is been used as carrier device for the substrates in the batch oven. A plurality of substrates, for instance, 150 wafers are brought into the boat. In the boat, the substrates stand parallel to each other and to one another. In some batch ovens, the boat is horizontally and vertically moveable in a boat transport room by a boat transport mechanism and is insertable to the process chamber, being also called stove pipe. Thereby, the process chamber is vacuum-tight closed in some ovens. Some batch-ovens provide gas-tight closing devices between the substrate loading and unloading area and the boat transport room. A problematic feature of batch-ovens is that these are only regularly suitable for thermal processing but not for plasma-enhanced substrate processing. Moreover, the wafer stack in the boat has a high thermal mass so that relatively long heating and cooling times have to be accepted.

Another type of device is known from the document WO 2011/148924 A1. In this type of device, six wafers are arranged parallel to each other and to one another upright on a wafer carrier. This wafer carrier is transported out of a lock chamber by an evacuated wafer carrier-transport room into rectangular-shaped coating chambers. Plasma-enhanced layer depositions are carried out in the coating chambers. A problematic feature of this device is, among other problems, that it can only process six substrates simultaneously in one chamber and therefore, only relatively low production speeds can be reached.

BRIEF SUMMARY OF THE INVENTION

It is, therefore, the object of the present invention to suggest a substrate processing device, which allows substrate processing at high quality by provision of high process purity, thereby being suitable for mass production because of its high substrate output.

The object is solved by a substrate processing device of the initially defined type, which is characterized in that the substrate loading and substrate unloading area is coupled with the carrier transport area by a substrate transfer area with at least one substrate transfer device for transferring the at least one substrate from at least one substrate cassette which is providable in the substrate loading and unloading are and in which substrates are arrangeable in different horizontal cassette levels of the substrate cassette, onto the at least one carrier device, with which the at least one substrate is holdable in a horizontal carrier level, wherein the substrate transfer area is closeable gas-tight against the substrate loading and unloading area.

The substrate processing device of the invention also comprises a substrate loading and unloading area, in/from which substrate cassettes can be introduced and discharged. Thereby, the substrate loading and unloading area can be provided for loading as well as unloading. But there can also be several, separate substrate loading and unloading areas provided, wherein, for instance, a substrate loading area is provided at the beginning of an in-line device and a substrate unloading area is provided at the end of an in-line device. In the substrate cassettes, several flat substrates are arranged parallel to each other in different cassette levels in a horizontal position.

A substrate transfer area is coupled with the substrate loading and unloading area. Thereby, a gas-tight closure between the substrate loading and unloading area and the substrate transfer area is provided, acting as barrier against impurities in the atmosphere, avoiding its transportation into the process chambers, subsequently providing an increased purity in the substrate processing device.

In the substrate transfer area, the substrates of the substrate cassette are transferred onto the carrier device provided in the carrier transport area or are transferred from the carrier device into the substrate cassette. According to the size of the substrate, different numbers of substrates can be placed on the carrier device. In extreme cases of exceptionally large substrates, with dimensions of more than five decimeter, only one substrate can be provided on the carrier device.

By the gas-tight closing between the substrate transfer area and the substrate loading and unloading area, the substrate transfer area comprises a sort of locking device between the substrate loading and unloading area and the carrier transport area. Moreover, the gas-tight closing allows the operation of the substrate transfer area at different pressure than the pressure present in the substrate loading and unloading area. This way, different measures can be realized in the substrate transfer area, which further increase the purity in the substrate processing device. For instance, rinsing cycles can be processed in the substrate transfer area.

In an advantageous embodiment of the substrate processing device of the invention, the substrate transfer area is fillable with inert gas. A defined and clean atmosphere is provided by the inert gas filling in the substrate transfer area, which is primarily defined by the purity of the inert gas used. Surface changes of the substrates can be avoided by the chemical inactivity of the inert gas. For instance, high quality of surface characteristics, for instance, measurable in terms of longer lifetimes of charge carriers, can, thereby, be reached. Alternatively, the substrate transfer area can, however, also be filled with vacuum or reactive gas such as forming gas.

In an especially preferred embodiment of the substrate processing device of the invention, the carrier device comprises substrate nests arranged in the carrier level in substrate carrier lines and substrate carrier columns, and the carrier device is moveable into the substrate carrier lines direction and/or into the substrate carrier columns direction. Especially with the widespread use of square substrates, the available area of the carrier device can be used well because of the arrangement in lines and columns, so that a high productivity is reachable. The linear arrangement in lines and columns is particularly simple so that transport mechanisms, provided in the substrate transfer area for the substrates, can be easily structured, respectively, in order to reach the substrate nests in the substrate carrier lines and substrate carrier columns. The orthogonal arrangement of substrate carrier lines and substrate carrier columns requires rectangular carrier devices, which are preferably provided for linear movements into the substrate carrier lines direction and/or the substrate carrier columns direction. In in-line devices, the substrate carrier transport regularly runs only in one direction, that is either in the direction of the substrate carrier lines or in the direction of the substrate carrier columns. In cluster devices, at which several processing modules are provided around a substrate transfer area in the direction of the substrate carrier lines and substrate carrier columns, the carrier device is moveable in two directions, that is, in the direction of the substrate carrier lines and in the direction of the substrate carrier columns. The substrate nests ensure a safe position of the substrates on the carrier device with lateral holding of the substrates so that the substrates do not get out of place when the carrier device is moving.

According to an advantageous embodiment of the substrate processing device of the invention, the substrate transfer device comprises a providable substrate loading level parallel to the carrier device and above the carrier transport area, from which the carrier device is equippable completely, line-wise or column-wise with substrates. The substrate loading level is horizontally oriented and is provided above the carrier device. The substrate carrier level is a convenient means, which provides a depot and an arrangement of the substrates to an exact position on the carrier device. A simple and fast load of the carrier device is possible from the substrate loading level.

According to a convenient embodiment of the substrate processing device of the invention, the substrate transfer device comprises at least one transfer bridge or transfer arm, which extends parallel to at least one substrate carrier line or substrate carrier column of the carrier device for loading and unloading of said substrate carrier line or substrate carrier column with at least one substrate. The transfer bridge respectively the transfer arm are preferably provided in the substrate carrier level respectively are introduceable in and dischargeable from these. By using the transfer bridge or the transfer arm, all substrate nests can be reached by means of the substrate transfer device. All substrate carrier lines or substrate carrier columns of the carrier device can be approached successively by the transfer bridge or transfer arm, or several substrate transfer bridges or transfer arms can be used in parallel at several substrate carrier lines or substrate carrier columns of the carrier device. The addressing of different substrate carrier lines respectively substrate carrier columns can be accomplished in various ways. In an especially advantageous example, the transfer bridge or the transfer arm for loading and unloading further substrate carrier lines or substrate carrier columns of the carrier device is moveable along the direction of a substrate carrier line and/or along the direction of a substrate carrier column.

Preferably, the substrate transfer device comprises at least one non-contact substrate handling device such as an ultrasound-enhanced Zimmermann-Schilp-handling device. Such substrate handling devices are handlingdevices, which can reliably handle even extreme thin substrates with low fracture risk of the substrates. Thereby, the substrates can be pressed, for instance, because of their weight, or, for instance, by low pressure suction against a gas cushion generated by ultrasound, which acts as spacer to the substrate handling device. Because of the non-contact working principle, advantageously no handler imprints appear on the substrates. In addition, high transfer times are realizable with such substrate handling devices. In contrast to other handling devices such as electrostatic grippers, the proposed non-contact substrate handling devices do not work in vacuum, but need a high gas density to form the gas cushions based on the operation principle of these handlers. The required gas density is, for instance, given at atmospheric pressure.

According to a preferable embodiment of the invention, by means of the substrate transfer device, the substrates can be especially suitable discharged from the substrate cassette and be inserted in it again, when the substrate cassette for the defined unload and return of the respectively uppermost cassette is coupled with a lift system.

A further embodiment of the substrate processing device of the invention comprises at least two carrier device levels, wherein in the carrier device levels located carrier devices are moveable independent of each other. Because of the presence of several carrier device levels, the productivity of the substrate processing device is increased. The single carrier device levels can lead to several substrate processing levels. But several carrier device levels can also only be provided, for instance, because of logistic reasons, in the carrier transport area of the substrate processing device. With bi-directional carrier device logistics and in the presence of several carrier device levels, one carrier device can give way another carrier device so that carrier devices can be moved without longer holding times in the substrate processing device.

Basically, the substrate processing device of the invention can also comprise several loading and unloading levels besides said several carrier device levels.

It is especially convenient, when the single carrier device levels of the substrate processing device are connected to each other by at least one carrier device lift. At least one carrier device can be moved to another carrier device level of the substrate processing device by means of the carrier device lift.

If the several carrier device levels described above are only provided to give way in the substrate processing device, it is further advantageous, if the carrier device lift comprises at least one further carrier device level besides the carrier device transport level.

Thereby, a carrier device can be stored temporarily on the carrier device lift, while another carrier device is transported. In another embodiment, there are at least three carrier device levels, that is the main carrier device level and at least one above and one below lying carrier device level.

According to a further embodiment, the substrate processing device of the invention comprises at least two process chambers coupled with the carrier transport area and stacked on top of each other. The production performance of the substrate processing device can be increased, for example doubled, by the process chambers stacked about each other. Thereby, the costs of the substrate processing device are increasing, in relation to a substrate processing device with process chambers only arranged in one level, less than the production performance. The carrier transport area is thereby formed in a way that all process chambers are reachable for the carrier devices.

In an advantageous embodiment of the substrate processing device of the invention, the substrate loading and unloading area comprises a cassette store, in which at least one substrate cassette is providable and coupleable with the substrate transfer device, if needed. The capacity of the substrate cassettes and of the carrier device is not always at an integer ratio. For example, the substrate cassettes have a capacity of 25 wafers and the carrier device a capacity of 42 wafers, that is, a second substrate cassette cannot be unloaded completely onto the carrier device. Hence, it is convenient for the remaining substrates in the second substrate cassette to store them temporarily in the cassette store, and to unload them from the cassette store to another carrier device. For instance, a common substrate cassette openable on one side can be provided and coupled with the substrate transfer device. Alternatively, a special store cassette can also be provided within the cassette store. The special store cassette can have the advantage, for instance, that it is, in contrast to the substrate cassette, open on two sides for the substrate transport.

It is especially advantageous, when the cassette store is evacuable and/or fillable with inert gas. The substrates are temporarily stored in the cassette store during the production process. Thereby, a change of the substrates can sometimes be observed in the cassette stores. Such effects can be suppressed or minimized by filling the cassette stores with inert gas or by evacuating the inert gas or by rinsing the cassette stores with evacuation or inert gas filling steps.

In another constructive embodiment of the substrate processing device of the invention, the carrier transport area comprises at least one tempering device, that is, at least one heating and/or cooling. The heating and/or cooling can be provided to increase the temperature homogeneity of the substrates and/or to increase the substrate heating or cooling speed.

According to another option of the substrate processing device of the invention, the substrate processing device comprises a substrate turning device. In the substrate processing device, a two-sided coating of substrates is, for instance, possible, wherein the coatings are provided in standardized process chambers from one substrate side. The substrates can be turned by using the suggested substrate turning device, so that the front side or the back side of the substrates is turned to the processing side of the coating chambers.

According to further embodiment of the substrate processing device of the invention, the substrate turning device is a substrate cassette rotating device. The turning of single substrates is relatively complicated in practice. The substrate turning can be implemented more easily through the suggested embodiment, wherein the substrates are initially transferred into the substrate cassettes, then the complete substrate cassettes are turned and afterwards the substrates are transferred again.

In a further embodiment of the substrate processing device of the invention, a substrate transfer station for transferring the at least one substrate from a carrier device onto another carrier device is provided between at least two carrier transport areas of the substrate processing device. In this embodiment, the substrate transport runs partly by means of the substrate transfer station, wherein the substrates are processed on different carrier devices in different parts of the device. This is convenient, for instance, when in one process chamber a carrier device is needed, which is conditioned by the substrate processing in this process chamber.

It is especially useful, when the substrate processing device of the invention comprises a substrate crack detection and/or a substrate crack disposal device. Such substrate crack disposal devices can be, for instance, a simple substrate crack extraction respectively also robotic arms with special grabber devices. Substrate cracks cannot completely be avoided, but they occur with a low probability. In certain circumstances, however, a substrate crack may significantly disturb the production process in a substrate processing device and may cause a major loss in production under certain circumstances. It is possible by the suggested substrate crack detection and the substrate crack disposal device to automatically detect a substrate crack and to dispose its effects. It is already advantageous, when only one substrate crack detection or only one substrate crack disposal device is provided in order to rectify the effects of the substrate crack more quickly.

In a special embodiment of the substrate processing device of the invention, at least one of the process chambers is physically lockable against a process module, in which the process chamber is provided, by the carrier device. In this case, the carrier device forms a wall, a bottom or a side wall of the process chamber. This is achieved by the carrier device which can be transported to the process chamber and also transported away from the process chamber by means of the carrier transport device.

Preferably, the device forms ae bottom of the process chamber. Thereby, the carrier device can be moved to a region below the process chamber by means of the carrier transport device and thereupon be pushed vertically up against the process chamber by means of a hub device to get a suitable physical closure of the process chamber against the process module surrounding the process chamber.

A roller transport system can advantageously be used as carrier transport device. Alternative carrier transport device are, for instance, linear motor transport systems, fork transport systems etc.

The at least one process chamber comprises, according to the present invention, one or multiple devices for the processing of the substrates. Preferred processing devices include devices for the production of plasma. Such a device can be, for instance, a planar HF-electrode, which is provided as gas shower. In this case, the carrier device forms preferably the counter electrode of a parallel plate arrangement. The implemented process chambers of the invention generally have all media supply connections such as pump connections, electrical supply connections, gas supply connections and connections for the supply of tempering devices etc. being necessary for the operation of the processing devices used as well as the substrate processing, respectively.

According to a further possible embodiment of the substrate processing device of the invention, said substrate processing device comprises at least one process module with at least one process chamber, respectively, wherein a transfer module is provided respectively between the at least one process module and the carrier transport area, which is closeable gas-tight against the process module and the carrier transport area. Thus, it is possible to optimally prepare the substrates in the transfer module for the subsequent processing in the process module. Moreover, substrates being already processed in the process module can be adequately adapted to the conditions in the carrier transport area in the transfer module. Therefore, an adequate atmosphere or also vacuum and/or an adequate temperature can be adjusted in the transfer module.

Such transfer modules can be particularly effectively used, if at least two levels for the carrier devices are provided in the transfer module. This way, in different levels being typically stacked on top of each other, a carrier device can be, for instance, transported simultaneously or deferred away from an adjacent process module, while in a different level of the transfer module a further carrier device is prepared for the transport into the process module.

In another embodiment, the substrate processing device of the invention comprises at least two process modules with at least one process chamber each, wherein an own carrier device is assigned to each process module. Preferably, the carrier transport area thereby forms a separation area for the process modules and an exchange area for substrates onto different carrier devices, respectively.

Preferred embodiments of the invention, their arrangement, function and advantages shall be explained in the following on basis of figures, wherein

BRIEF DESCRIPTION OF THE SEVERAL VIEWS OF THE DRAWING

FIG. 8 schematically shows a cross-section of another embodiment of a multi-chamber process module being useable in the invention;

FIG. 9 schematically shows a cross-section of a substrate processing device of the invention with a multi-chamber process module;

FIG. 10 schematically shows a cross-section of a further variant of a substrate processing device of the invention;

FIG. 11 schematically shows a cross-section of an embodiment of a substrate processing device of the invention;

DESCRIPTION OF THE INVENTION

Figure 1:
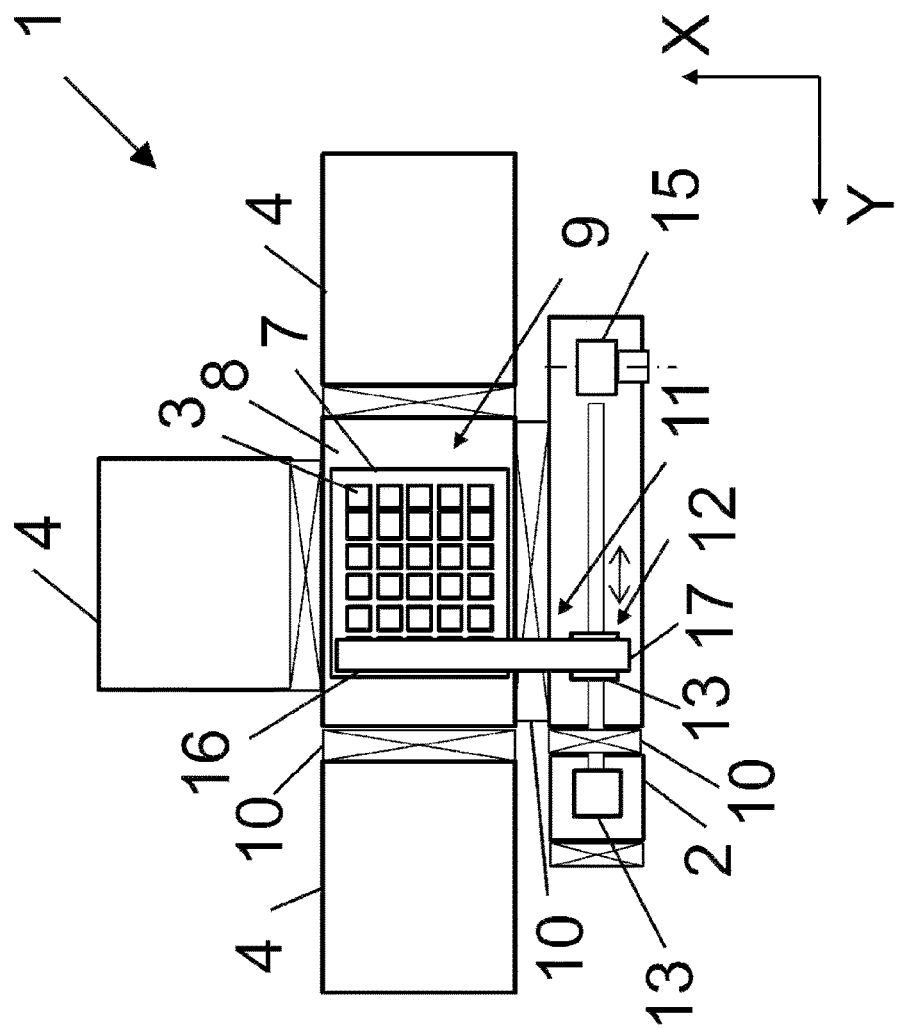
FIG. 1 schematically shows an embodiment of a substrate processing device of the invention with three process modules in a top view.

FIG. 1 schematically shows a top view of an embodiment of a substrate processing device 1 of the invention. Here, substrates 3 are first introduced into the substrate processing device 1 through a substrate loading and unloading area 2 in substrate cassettes 13, and after processing, they are removed from the substrate processing device 1. The substrate loading and unloading area 2 is followed by a substrate transfer area 11, which is separable from the substrate loading and unloading area 2 by a gas-tight closure device 10. In the substrate transfer area 11, a transfer of substrates 3 between a substrate cassette 13 and a carrier device 7 located in a carrier transport area 9 is provided by means of a substrate transfer device 12.

In the embodiment shown in FIG. 1, the carrier device 7 is a so-called carrier with substrate nests, in which the substrates 3 are placed. These substrate nests are provided in substrate carrier lines and substrate carrier columns. The substrate carrier line with, presently, five substrate nests is operatable by the substrate transfer device 12, the substrates 3 are transported in the direction of the substrate carrier line X to the substrate nests. Therefore, the substrate transfer device 12 comprises a transfer bridge 16 respectively a corresponding transfer arm, along which the substrates 3 can be transported to the respective substrate nests, arranged parallel to a substrate carrier line of the carrier device 7 and above the carrier device 7. To load all substrate carrier lines, the substrate transfer device 12 is moveable in the direction of the substrate carrier column Y.

In the embodiment shown in FIG. 1, the substrate transfer device 12 comprises a non-contact substrate handling device 17, with which the substrates 3 can be taken without contact from a substrate cassette 13 and can be placed on the carrier device 7 by the transfer bridge 16. An ultrasound-enhanced Zimmermann-Schilp-handling device, for instance, is suitable as such a substrate handling device 17. Other adequate substrate handling devices, however, can also be used to load the carrier device 7 with substrates 3 respectively to unload the substrates 3 from the carrier device 7.

The transfer arm respectively the transfer bridge 16 can, instead, be interrupted in the region of the gas-tight closure device 10 and can have its own motion drive, whereby the substrate transport is provided across the closure device 10. In another variant, the transfer arm respectively the transfer bridge 16 is only moved into the carrier transport area 9 after opening the closure device 10. In a further variant, the closure device 10 between the carrier transport area 9 and the substrate transfer area 11 can be omitted. The carrier device 7 can be moved to each of the three provided process modules 4 in the carrier transport area 9 in the embodiment presented. The process modules 4 comprise at least one process chamber 5 respectively besides a carrier transport device 8 for the carrier device 7 running through the carrier transport area 9. A different coating can be made, for instance, in each process chamber 5.

Each process module 4 can be provided with its own carrier device 7. This is advantageous, if, for instance, processes in other process modules 4 of the substrate processing device 1 are running, at which a dispersion of impurities by the carrier device 7 itself may not be avoided. It can be problematic, if, for instance, a first coating with addition of dopants is provided in a first process module 4, and a doped layer shall be deposited in another process module 4 in a following processing step. The carrier transport area 9 then simultaneously serves as separation area of the process modules 4 and as exchange area of the substrates 3 on different carrier devices 7, respectively. The single carrier devices 7 can then also have different temperatures.

The substrate processing device 1 further comprises a substrate transfer area 11 coupled with the cassette rotating device 15, with which the substrate cassette 13 can be rotated so that, for instance, the substrates 3 can be turned after a coating of the front side of the substrates 3 and subsequently the coating can be done on the back side of the substrates.

The carrier transport area 9 is separable from the process modules 4 by a gas-tight closure device 10, respectively. This way, the process modules 4 can be run under a different pressure than the substrate transfer area 11.

Figure 2:
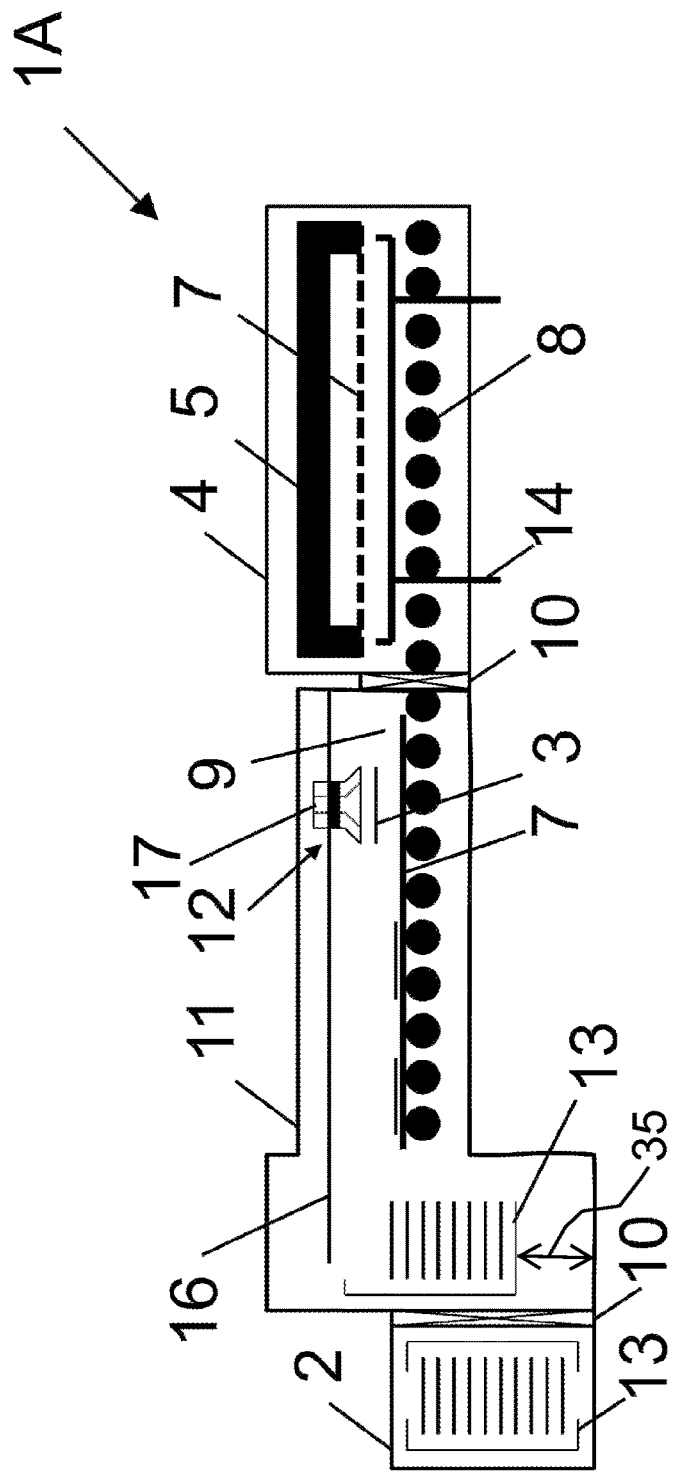
FIG. 2 schematically shows a cross-section of a further embodiment of a substrate processing device of the invention.

FIG. 2 schematically shows a cross-section of another variant of a substrate processing device 1A of the invention. Thereby, same reference signs mean same respectively similar elements as in the substrate processing device 1 of FIG. 1 described above, why, in this context, a reference is made to the description above. The same applies for the description of further figures.

A substrate cassette 13 is provided in the substrate loading and unloading area 2 of the embodiment shown in FIG. 2. After the input of the substrate cassette 13, a clean and defined atmosphere is created through evacuation in the substrate loading and unloading area 2. If a sufficient cleanliness is reached in the substrate loading and unloading area 2, the gas-tight closure device 10 is opened and the substrate cassette 13 is transferred to the substrate transfer area 11. In the substrate transfer area 11, the substrates 3 are transferred from the substrate cassette 13 by means of the substrate transfer device 12 onto the carrier device 7 being in the carrier transport area 9.

In the embodiment shown in FIG. 2, the substrate transfer device 12 comprises a non-contact, ultrasound-enhanced substrate handling device 17, which is guided at the transfer bridge 16. The substrate handling device 17 can, as has already been mentioned above, grab substrates 3 contactless and with low forces. Thereby, the lifting force is produced, for instance, by under pressure in under pressure channels. The distance necessary for the non-contact transport to the substrate handling device 17 is ensured by an ultrasound-produced gas cushion. The substrate handling device 17 shown does not work as a matter of principle under vacuum but only at increased pressure, for instance, atmospheric pressure. The substrate handling device 17 does not leave any operating imprints on the substrates 3 and is, therefore, suitable for handling substrates 3, which have functional surfaces on both sides of the substrates, for which high demands on purity exist. It is advantageous, if the substrate cassette 13 for defined loading or unloading of the respective uppermost substrate 3 is connected to a lift system 35.

The loaded carrier device 7 is transported in the carrier transport area 9 to a process module 4 by the carrier transport device 8. In there, the carrier device 7 is also moved, by means of the carrier transport device 8, to a process chamber 5, where a processing of the substrates 3 is provided. A roller transport system is used here as an example for carrier transport device 8.

In the embodiment shown, the carrier device 7 is lifted by a hub device 14 from the carrier transport area 8 in the process module 4 and is used as bottom of the process chamber 5. The position of the carrier device 7 when the process chamber 5 is closed is sketched by a dotted line in the process module 4 of FIG. 2. The substrates 3 are unloaded contrarily to the loading procedure after the processing of the substrates 3 in the process chamber 5.

Figure 3:
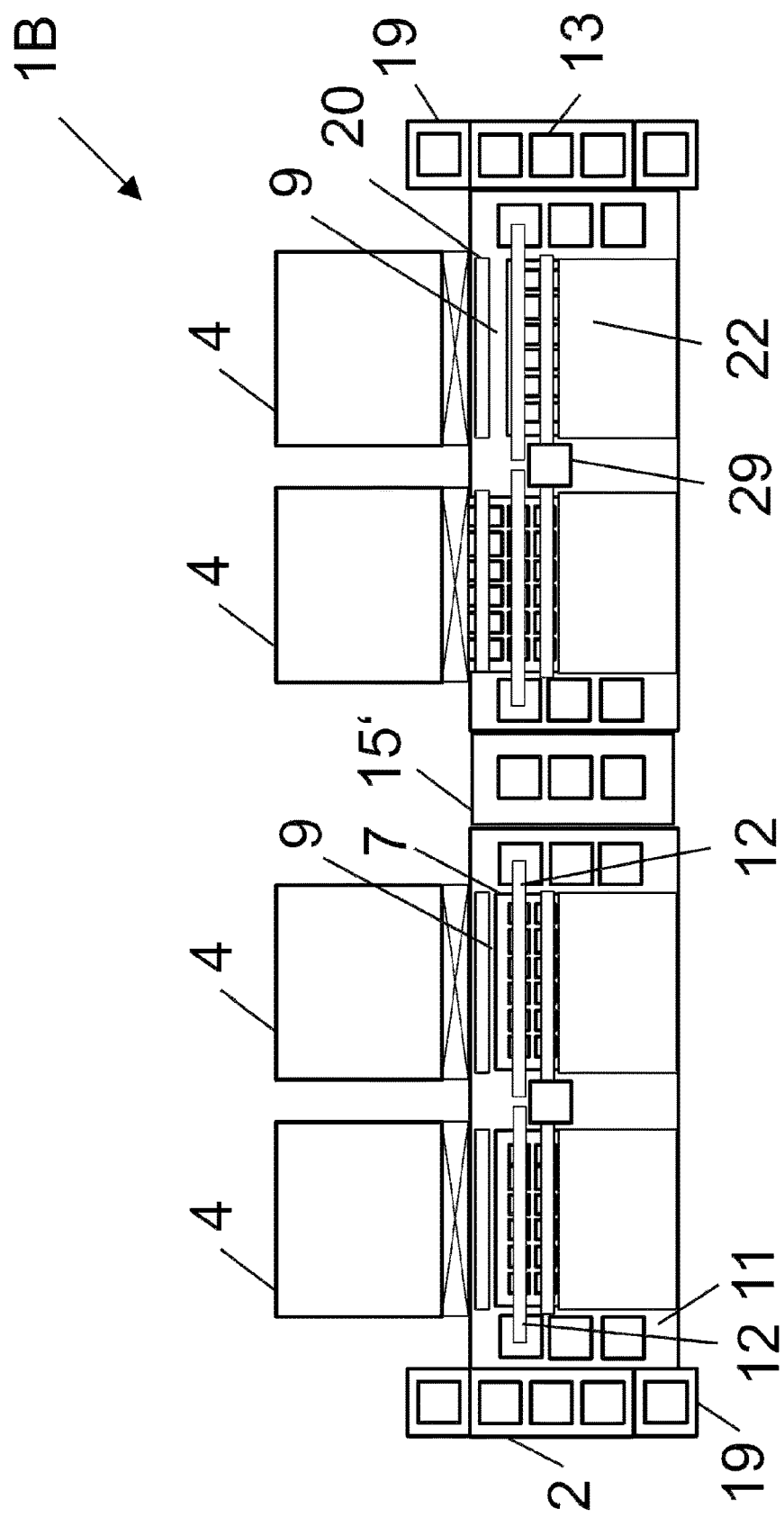
FIG. 3 schematically shows a variant of a substrate processing device of the invention with four process modules, which is provided as in-line device, in a top view.

FIG. 3 schematically shows a further developed version of a substrate processing device 1B of the invention, which comprises four process modules 4. The substrate processing device 1B is provided as in-line device, at which substrate cassettes 13 are loaded at the left side of the illustration. Afterwards, the substrates 3 run through the substrate processing device 1B. Finally, the substrate cassettes 13 with the processed substrates 3 are unloaded at the right side of the illustration.

Two carrier devices 7 can be provided in the substrate transfer area 11 of the substrate processing device 1B. A substrate transport is possible between a substrate cassette 13 and a carrier device 7 as well as between both carrier devices 7 by the substrate transfer devices 12. Between both carrier transport areas 9, a substrate cassette rotating device 15' is provided, in which three substrate cassettes 13 can be rotated simultaneously as shown in the example, so that one substrate side can be turned downside towards upward respectively turned conversely.

Further, the substrate processing device 1B of FIG. 3 comprises substrate crack detectors 20, by which damaged substrates 3 can be optically identified. If a crack-endangered or broken substrate 3 is detected, this defective substrate 3 can be immediately removed by means of an also present substrate crack suctioning so that the production process is only slightly disturbed. Two cassette stores 19 are provided at the substrate loading and unloading areas 2, respectively. Substrates 3 can be temporarily stored in the cassette stores 19, which, for instance, incur at unequal capacities of substrate cassettes 13 and carrier devices 7.

Figure 4:
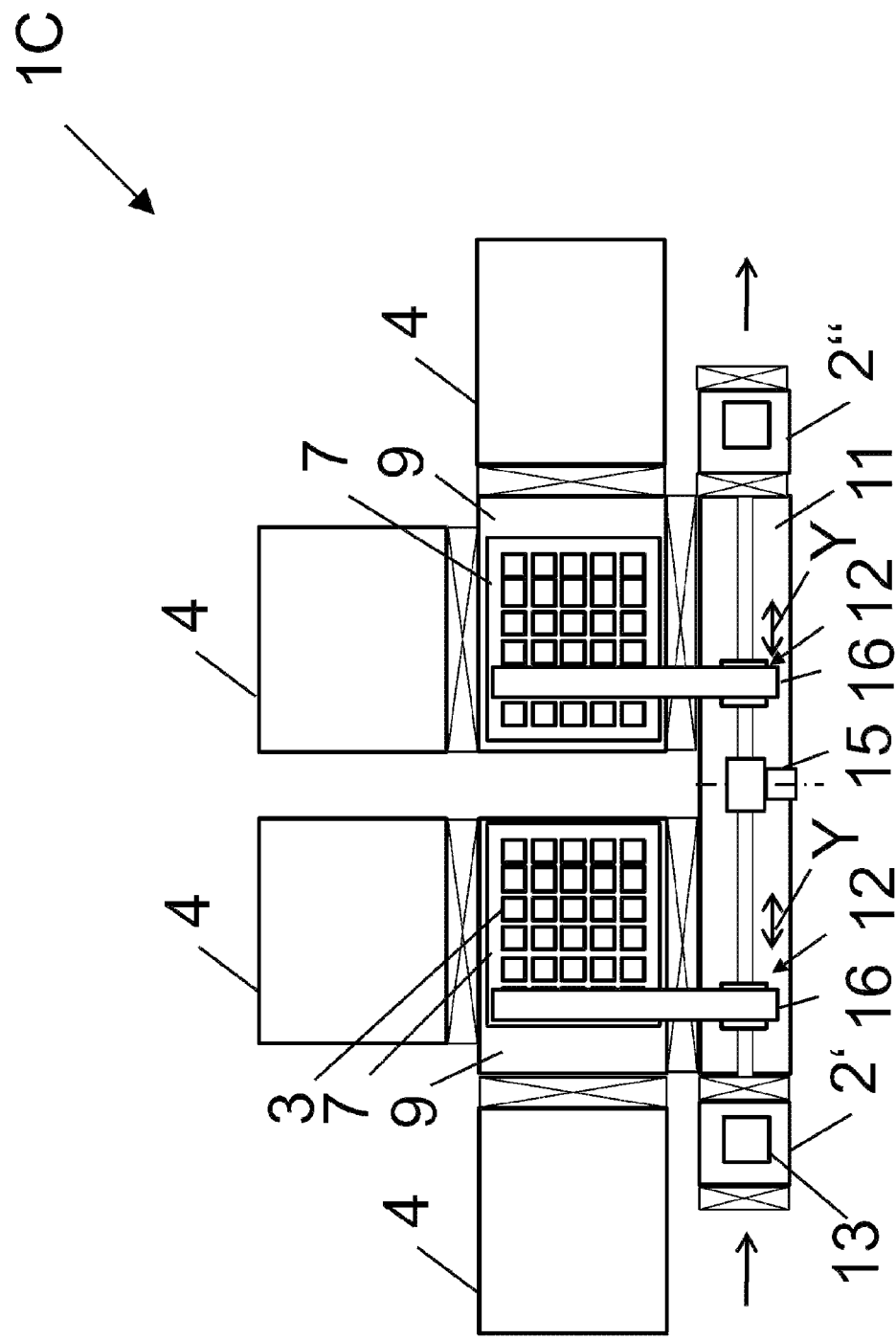
FIG. 4 schematically shows another embodiment of a substrate processing device of the invention with four process modules in a top view.

FIG. 4 schematically shows another embodiment of a substrate processing device 1C of the invention with four process modules 4 in a top view. In the variant of FIG. 4, the substrate processing device 1C comprises two carrier transport areas 9 separated from each other, at which a process module 4 is provided respectively in the direction of the substrate carrier line X and one process module 4 in the direction of the substrate carrier column Y. A carrier device 7 is provided respectively in the carrier transport areas 9, which is loadable with substrates 3 by means of a substrate transfer device 12, respectively. In the example shown, a substrate transfer area 11 is provided, in which the transfer bridge 16 of the substrate transfer devices 12 is moveable into the direction of the substrate carrier column Y of the carrier devices in order to load all substrate nests of the carrier device 7 with substrates 3 respectively to unload the substrates 3 from the substrate nests.

Thereby, a carrier device 7 with substrates 3 can be processed either one after another in both process modules 4 in the substrate processing device 1C, or two carrier devices 7 are provided, which run in a pendulum mode, wherein a processing of substrates 3 loaded on a carrier device 7 in a process module 4 and a transfer operation on a different carrier device 7 are simultaneously provided.

The substrates 3 of the substrate processing device 1C of FIG. 4 are initially introduced to a substrate loading area 2'. At this stage, the substrates 3 are still in a substrate cassette 13, in which the substrates 3 are provided in different horizontal cassette levels of the substrate cassette 13. The substrate cassette 13 are then introduced to the substrate transfer area 11 after running through a gas-tight closeable lock, where the substrate cassette 13 is moveable along the direction of the substrate carrier column Y marked by the arrows in FIG. 4. Thereby, the substrates 3 located in the substrate cassette 13 are distributed onto the carrier devices 7 by means of the substrate transfer device 12 and by using the transfer bridges 16. At least one carrier device 7 loaded with the substrates 3 is subsequently introduced to one of the process modules 4 to be processed in one of the process chambers therein by means of the carrier transport device 8, which, for instance, is shown in FIG. 2. The processing can be, for instance, a layer deposition, but can, however, also be a plasma processing, an etching step, a temperature treatment and/or another suitable process step.

After the processing of a substrate side, for instance, in the two process modules 4 shown on the left of the substrate processing device 1C has been finished, the substrates 3 are turned by means of a substrate cassette rotating device 15 being between the two carrier transport areas 9. Afterwards, a processing of the second substrate side in the other two process modules 4 shown on the right of FIG. 4 is carried out. Finally, the substrates 3 are transferred to a substrate cassette 13 and unloaded from the substrate unloading area 2", shown on the right side of FIG. 4, of the substrate processing device 1C.

Figure 5:
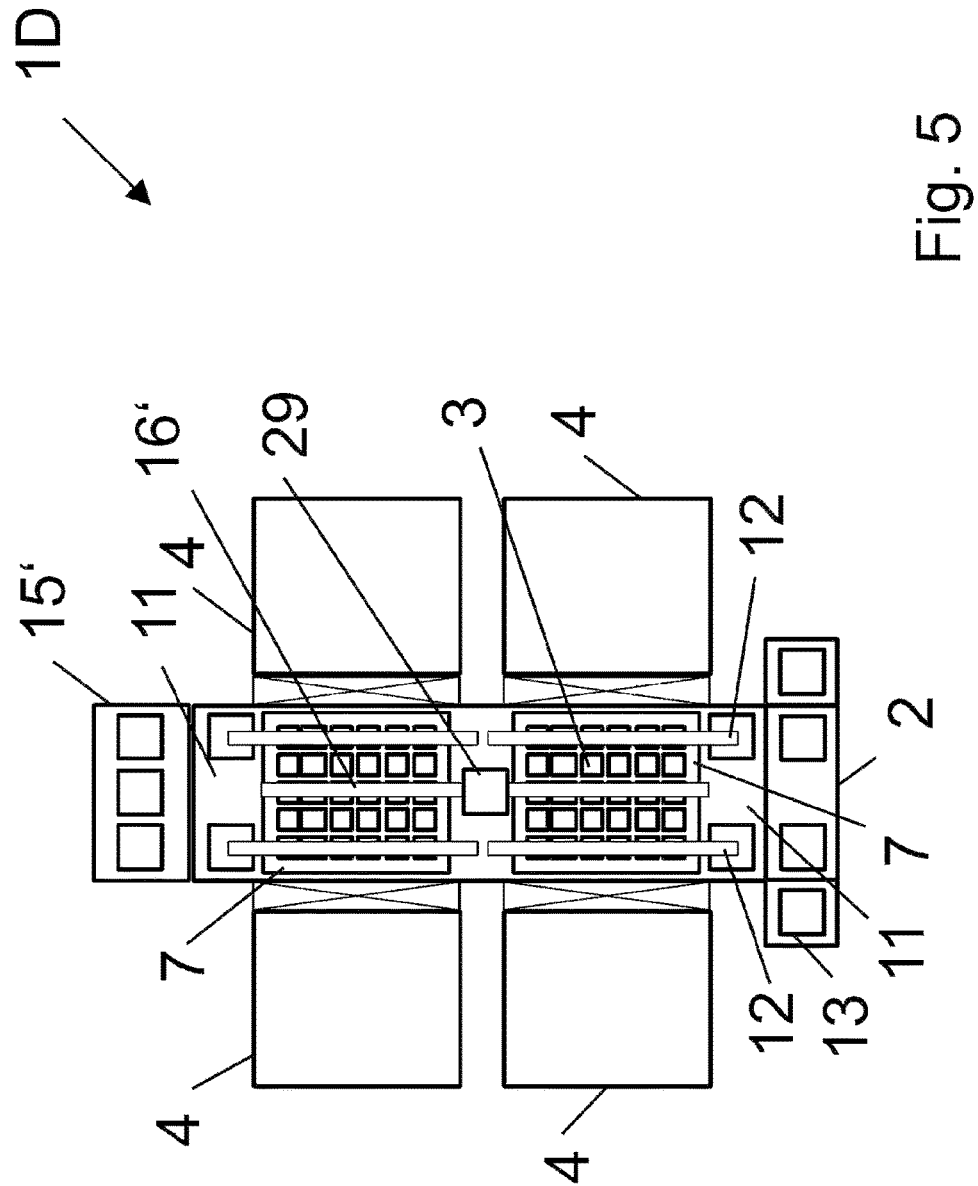
FIG. 5 schematically shows a further example of a substrate processing device of the invention with four process modules in a top view.

FIG. 5 shows another alternative embodiment of a substrate processing device 1D of the invention with four process modules 4 of the invention in a top view. Respectively, two process modules 4 are arranged parallel to the substrate carrier lines in the substrate processing device 1D on both sides next to the carrier transport area 9. Two of those process modules 4 are provided for the front side-coating of the substrates 3, and the other two process modules 4 are provided for the backside-coating after turning the substrates 3 in the substrate cassette rotating device 15'.

The substrate processing device 1D is no in-line device, but the substrates 3 are loaded and unloaded through a single substrate loading and unloading area 2. Thereby, the substrates 3, similar to the previously mentioned examples, are initially introduced in a substrate cassette 13 into the substrate processing device 1D, and are then applied from the substrate cassette 13 on at least one carrier device 7 by means of substrate transfer devices 12. With the help of the carrier device 7, the substrates 3 laying on the carrier device 7 can then be introduced in one of the process modules 4 to be processed in one of the process chambers therein. After the substrates have been processed, the corresponding carrier device 7 is transported out of the process module 4 by means of the used carrier transport device. After that, the respective carrier device 7, for instance, can be transported again by means of the carrier transport device to the process module 4 located on the other side of the carrier transport area 9. The other process module 4 also provides a process chamber not illustrated in FIG. 5, in which the substrates 3 can be introduced to another process step. After processing the substrates 3, again they are transported laying on the carrier device 7 to the carrier transport area 9 and can be, for instance, re-introduced to the corresponding substrate cassettes 13 by means of the substrate transfer devices 12.

As can be seen in FIG. 5, a substrate transfer station 29 between the two carrier transport areas 9 can be provided for transferring the substrates 3 from one carrier device 7 to another carrier device 7. The substrate transfer station 29 can be structured similar to the substrate transfer device 12 described above and thus, contactlessly taking the substrates 3 from a carrier device 7, proceeding along a transfer arm respectively a transfer bridge 16' above the carrier devices 7 and subsequently applying the substrates 3 onto the other carrier device 7.

Corresponding to the high production speed in four process modules 4, for each of the two carrier devices 7 in the substrate transfer area 11, two parallel operating substrate transfer devices 12 are provided in the substrate processing device 1D.

Figure 6:
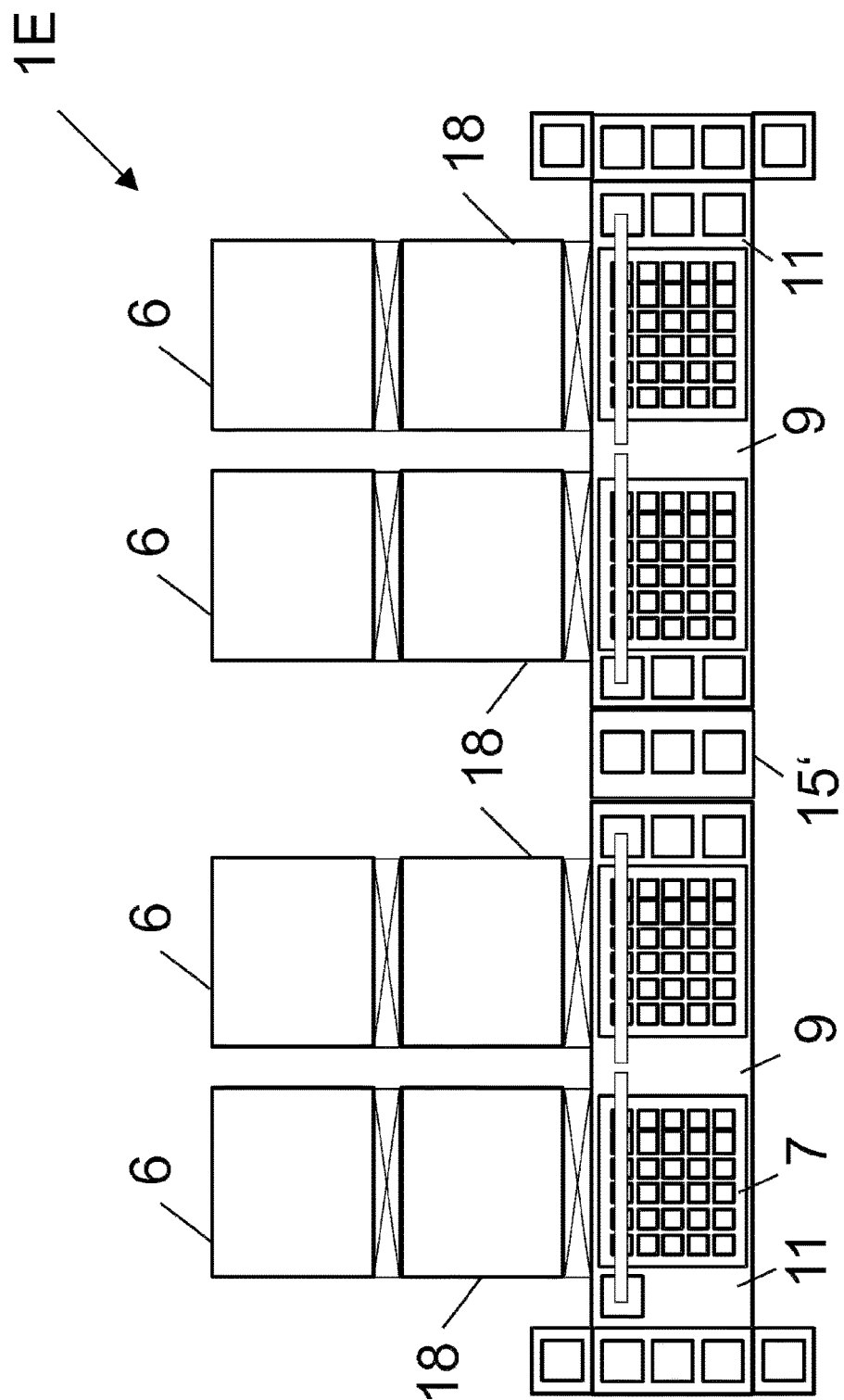
FIG. 6 schematically shows a further embodiment of a substrate processing device of the invention with four multi-chamber process modules in a top view.

FIG. 6 shows a top view of a further option of a substrate processing device 1E of the invention, comprising four multi-chamber process modules 6. Two process chambers 5 are vertically stacked in each of the multi-chamber process modules 6. In other, non-illustrated embodiments of the invention, more than two vertically stacked process chambers 5 can be provided in the multi-chamber process modules 6 on top of each other. Moreover, single multi-chamber process modules 6 shown in FIG. 6 can also be replaced by simple process modules 5 as shown in the aforesaid figures.

A transfer module 18 is provided between the carrier transport areas 9 and the multi-chamber process modules 6, respectively. The transfer module 18 is separated, one the hand, from the accompanying multi-chamber process module 6 by vacuum-tight gates or closure devices, and on the other hand, from the carrier transport area 9, respectively. For instance, a heating or cooling of the substrates 3, which have to be processed or have already been processed in the multi-chamber process module, can be provided within the transfer module 18. Moreover, an adequate atmosphere has to be adjusted in the transfer module 18. The transfer module 18 can be evacuated.

A carrier device lift not-illustrated in FIG. 6 can be provided within the transfer module 18, with which the respective carrier device 7 can be brought to one level, which corresponds to the respective process chamber 5 in the multi-chamber process module 6, in which the substrates 3 laying on the carrier device 7 are to be processed. In addition, the carrier device 7 can also be transferred by means of the carrier device lift to another level, in which the respective carrier device 7, for instance, can be moved past another carrier device 7, which is transported on another carrier device level.

Figure 7:
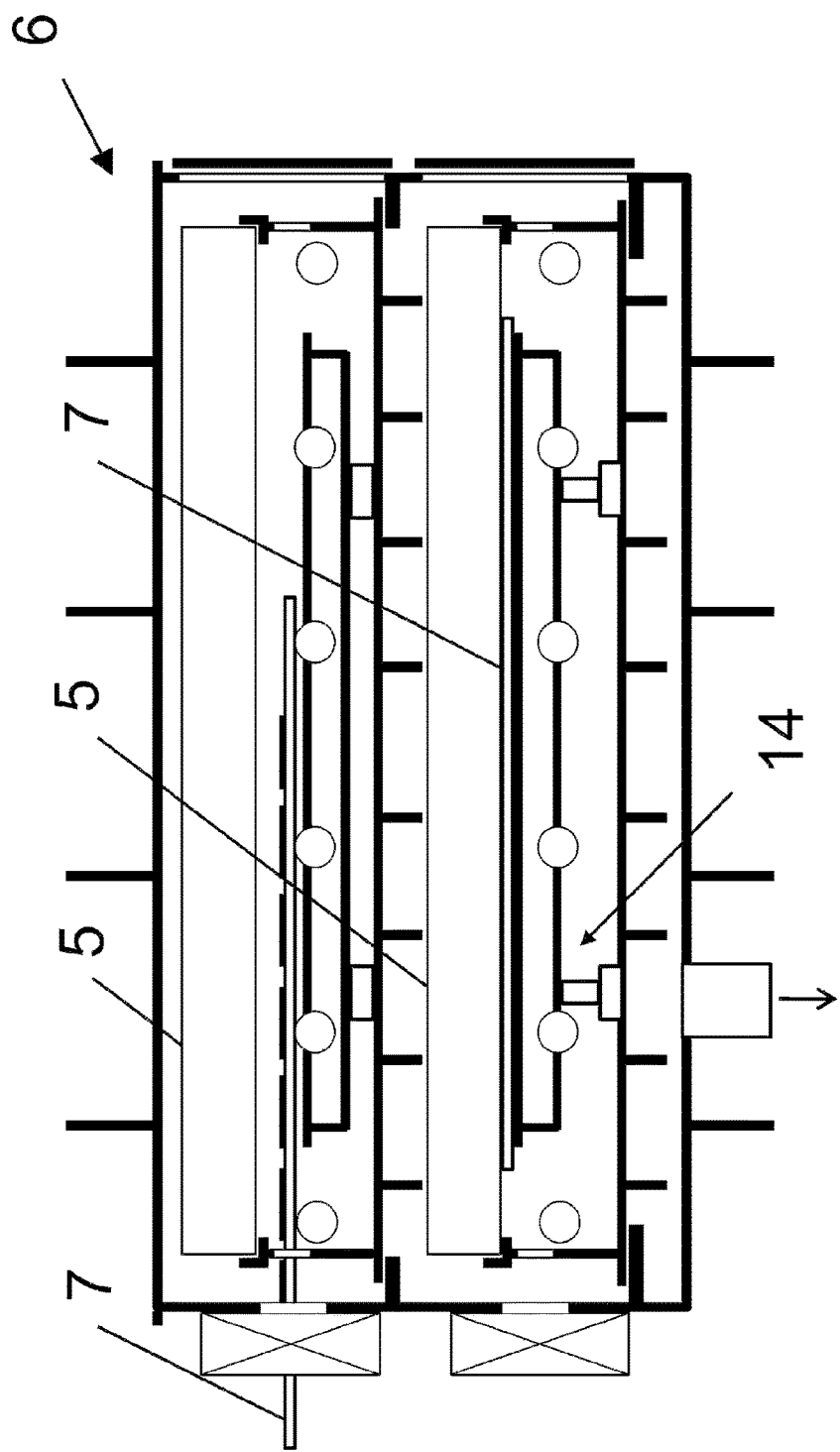
FIG. 7 schematically shows a cross-section of a multi-chamber process module applicable in the substrate processing device of the present invention.

FIG. 7 schematically shows a cross-section of a multi-chamber process module 6 which can be used, for instance, in the embodiment of FIG. 6. In the embodiment presented, the multi-chamber process module 6 comprises two vertical stacked process chambers 5. In other, not-illustrated embodiments, the multi-chamber process module 6 can comprise more than two process chambers 5.

The carrier device 7 of the process chambers 5 shown in FIG. 7 serves as bottom of the process chamber 5. The upper carrier device 7 of FIG. 7 is shown during a transport with a roller transport system used in the carrier transport device 8. In this state, the bottom of the upper process chamber 5 is missing and the upper process chamber 5 is open towards the process module 6. The lower carrier device 7, however, closes the lower process chamber 5 by being pressed against the lower process chamber by a hub device 14. The multi-chamber process module 6 is a closeable chamber, which is closeable against its environment and neighboring modules of the substrate processing device 1E.

FIG. 8 schematically shows a cross-section of a further multi-chamber process module 6' being applicable in the substrate processing device 1E of FIG. 6. The process module 6' comprises, in contrast to the process module 6 shown in FIG. 7, a closeable insulation chamber 25 for each of the process chambers 5. The closeable insulation chamber 25 can be provided, for instance, as additional insulation stage for a better thermal and chemical decoupling of the process chamber 5 from the outer atmosphere. In another embodiment, the insulation chamber 25 can also be provided as auxiliary device for a cleaning process of the process chamber 5, at which the lowered carrier device 7 is cleaned with an etching plasma in a closed insulation chamber 25 when the process chamber 5 is opened. In the lowered position of the carrier device 7, the edge regions of the carrier device 7 are also cleaned in contrast to a closed process chamber 5. The insulation chamber 25 prevents thereby the expansion of cleaning gases into the process module 6'.

The process chambers 5 comprise thereby preferably one or several devices for the production of plasma. Such a preferred device can, for instance, be a planar RF-electrode being provided as gas shower. In this case, the carrier device 7 forms the counter electrode of a parallel plate arrangement. The process chambers 5 also provide all necessary media supply connections such as pump connections, electrical supply connections, gas supply connections and devices for tempering.

FIG. 9 schematically shows a cross-section of a substrate processing device 1E of the invention with a multi-chamber process module 6. The multi-chamber process module 6 can be formed, for instance, as shown in FIG. 7. Reference is made to the description above. In FIG. 9, an embodiment of a transfer module 18 is shown in more detail. In the transfer module 18 shown, two transport levels are provided for carrier devices 7, which are marked by the drafted transport rollers 26. The carrier devices 7 can be transported from both transport levels in the transfer module 18 into both transport levels of the multi-chamber process module 6. The carrier devices 7 can be moved between both transport levels with a carrier device lift 28. Thereby, the transport rollers 26 can be moved in the direction of their centerlines to make room required for a lifting movement of the carrier device 7. The transfer module 18 further comprises at least one heating and/or cooling device such as a heating plate, radiation heating and/or a cooling unit, for heating and/or cooling of the carrier device 7. The transfer module 18 relates to the carrier transport area 9 and thus, provides a connection between the substrate transfer area 11 and the multi-chamber process module 6.

The FIGS. 10 and 11 schematically show a cross-section of substrate processing devices 1F and 1G of the invention. The substrate processing devices 1F and 1G comprise process modules 4 containing a process chamber 5, respectively. The substrate processing device 1G comprises, in contrast to the substrate processing device 1F, an insulation chamber 25 for an inclusion of the process chamber 5. Both substrate processing devices 1F and 1G comprise a transfer module 18', which only has one transport level shown by the illustrated transport rollers 26, respectively. The transfer modules 18' are provided for handling of two carrier devices 7. While one carrier device 7 is located in the transport level, a second carrier device 7 can be temporarily stored on a carrier device lift 28. By temporary storing, it is possible to reduce latencies of carrier devices 7 in the carrier transport area 9. Generally, further spots in the carrier device lift 28 can be provided as temporary store.

Figure 12:
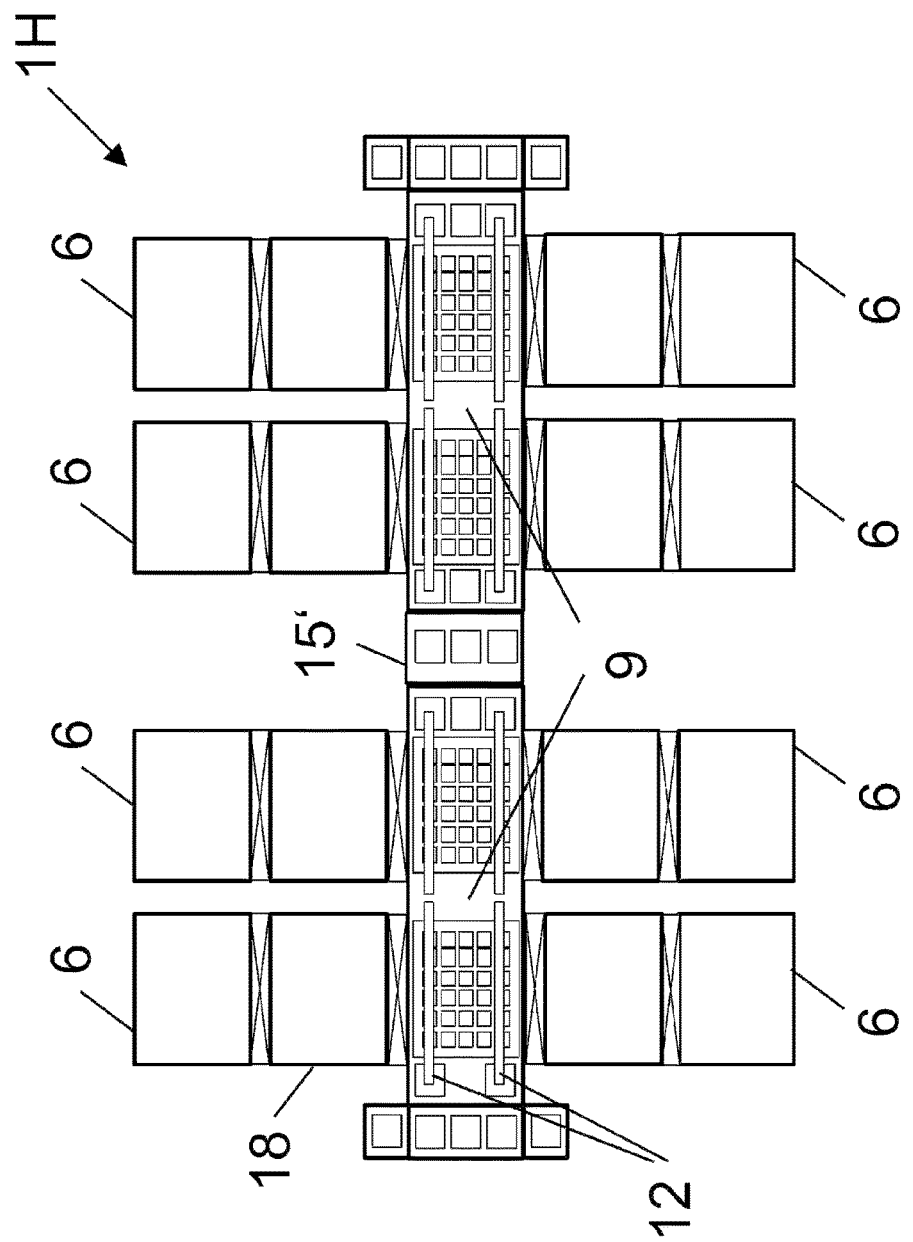
FIG. 12 schematically shows an embodiment of a substrate processing device of the invention in a high configuration level in a top view.

FIG. 12 schematically shows a further substrate processing device 1H of the invention comprising eight multi-chamber process modules 6. The substrate processing device 1H comprises accordingly 16 process chambers and provides a corresponding high production output. The carrier transport areas 9 are coupled with four substrate transfer devices 12 each in the embodiment shown to meet the high logistic requirements in this substrate processing device 1H.

Figure 13:
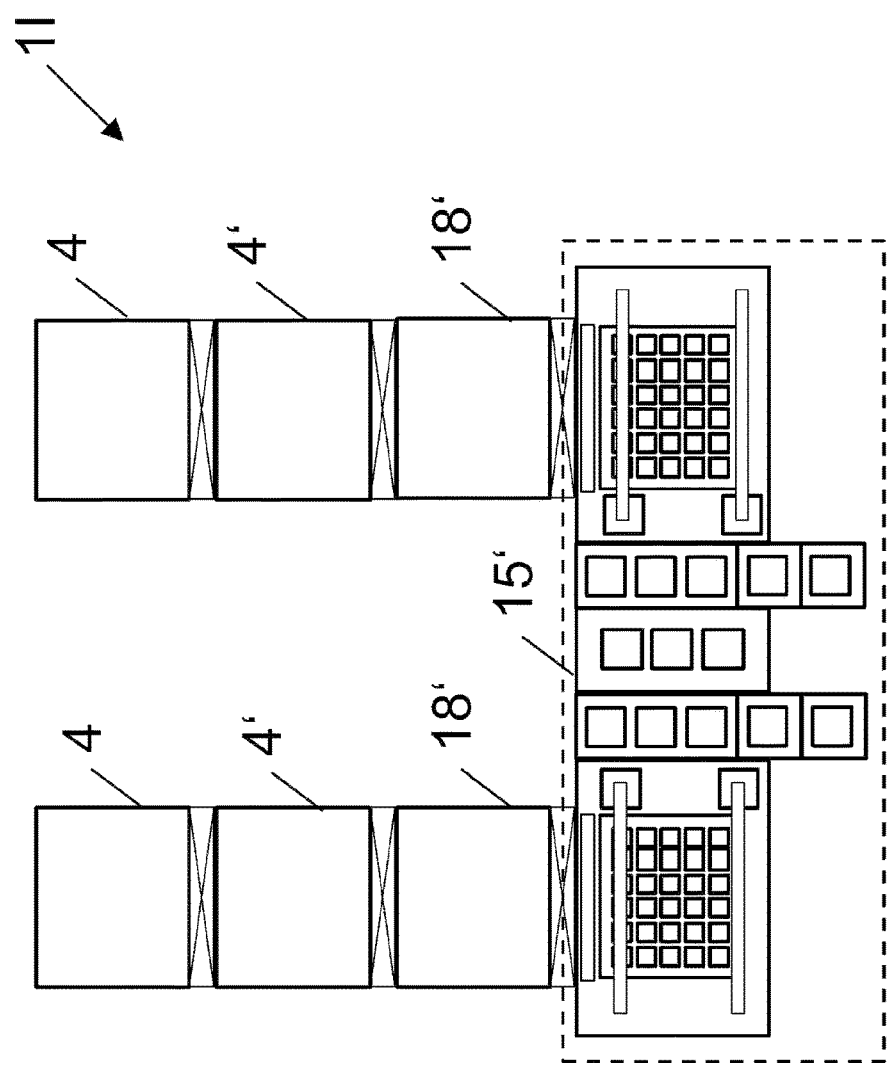
FIG. 13 schematically shows an embodiment of a substrate processing device of the invention with linear sequences of process modules in a top view.

In FIG. 13, another embodiment of a substrate processing device 1I of the invention is schematically shown in a top view. The substrate processing device 1I comprises two linear in-line arrangements of a transfer module 18', a process module 4', and a process module 4. The process module 4' is provided with closeable channels for a passage of carrier devices 7 at two sides. The linear in-line arrangement of process modules 4, 4' is a relatively simple opportunity for the development of substrate processing devices of the invention. A disadvantage, which has to be taken into account when using the linear in-line arrangement of process modules 4, 4' is the increased logistic effort when transporting the carrier devices 7.

It is advantageous, when several levels for the carrier devices 7 are provided in the transfer modules 18, 18'. Hence, several carrier devices 7 can be exchanged either simultaneously or one after another between atmosphere and vacuum in the locking process, thereby reducing the number of arising ventilations respectively evacuations of the transfer modules 18, 18'.

Figure 14:
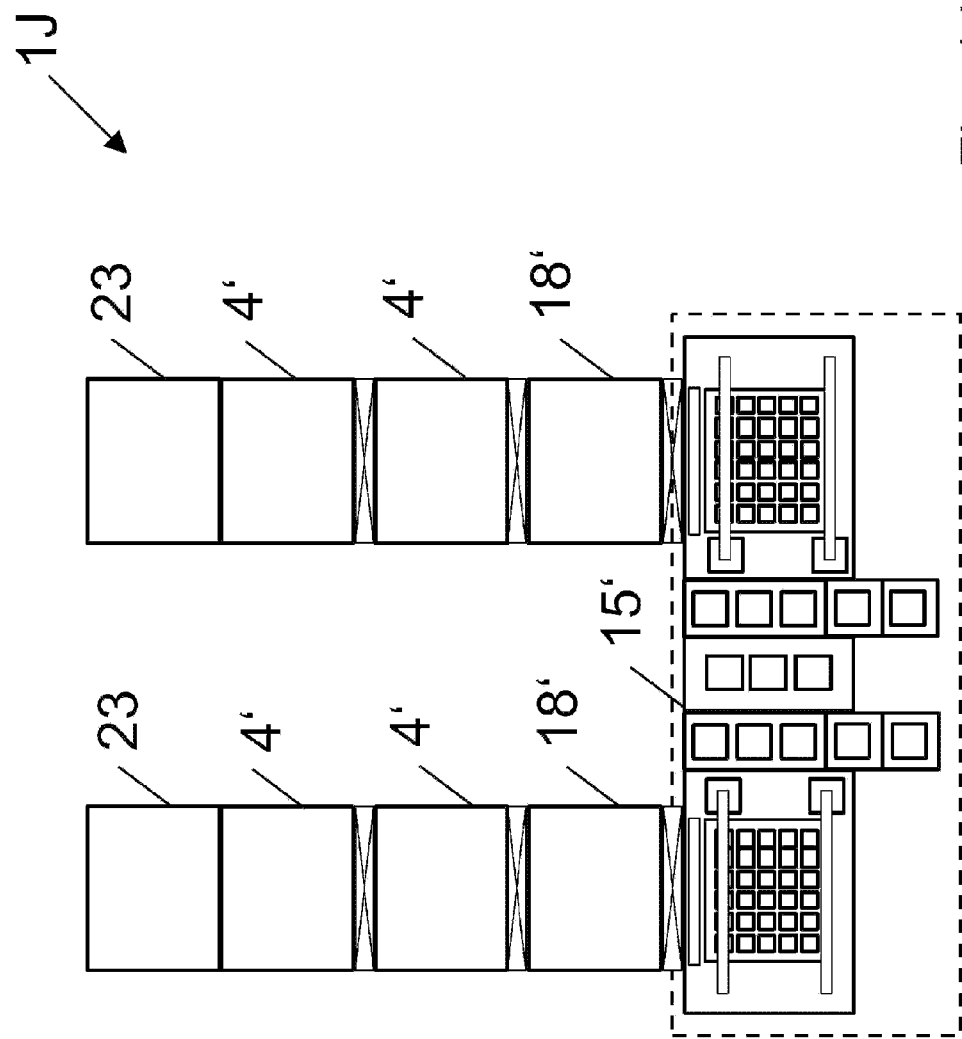
FIG. 14 schematically shows another substrate processing device of the invention with linear sequences of process modules in a top view.

Another substrate processing device 1J of the invention with linear in-line arrangements of process modules 4' is shown in FIG. 14. The substrate processing device 1J is further developed in comparison to the substrate processing device 1I by carrier device stores 23, which are coupled to the outer process modules 4'. The carrier device stores 23 can temporarily store carrier devices 7, thereby reducing logistic latencies when transporting carrier devices 7.

Figure 15:
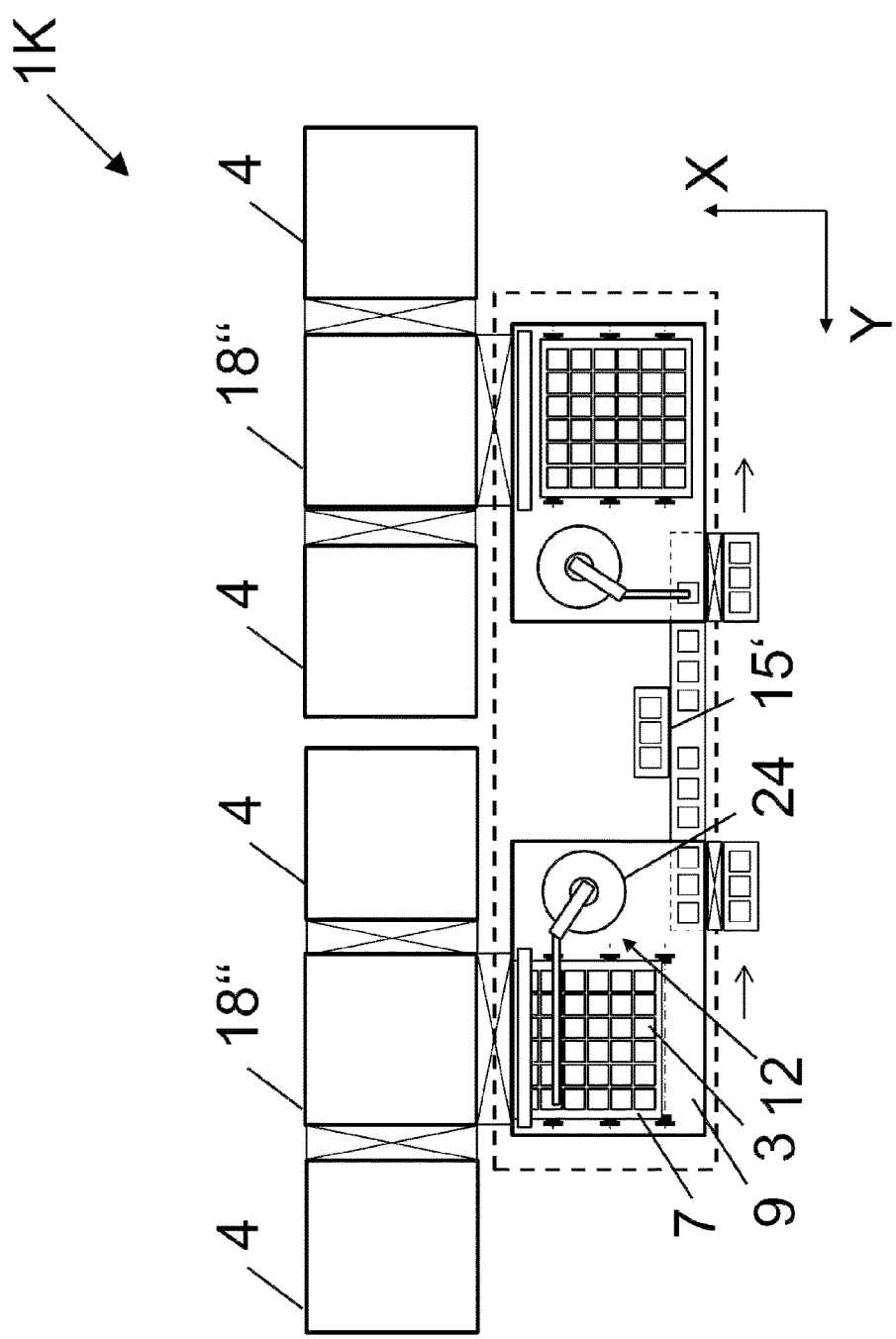
FIG. 15 schematically shows a further embodiment of a substrate processing device of the invention in a top view.

Another embodiment of a substrate processing device 1K of the invention is schematically shown in a top view in FIG. 15. Other embodiments of substrate processing devices of the invention are illustrated on basis of the substrate processing device 1K. The substrate transfer device 12 is presently provided in form of a transfer robot 24 and not as a transfer bridge. The transfer robot 24 comprises a rotatable and linearly extendable robotic arm reaching all substrates 3 on a carrier device 7. Moreover, the substrate processing device 1K comprises two transfer modules 18" comprising a carrier device lift 28 and a buffer for carrier devices 7. The transfer module 18" enables the transport of carrier devices 7 in the direction of the substrate carrier line X as well as in the direction of the substrate carrier column Y. The substrate processing device 1K is provided with two process modules 4 each at the transfer module 18" in the direction of the substrate column Y. The carrier transport areas 9, however, are provided at the transfer modules 18" along the direction of the substrate carrier line X. The process modules 4 can also be provided as multi-chamber process modules. This embodiment can generally be applied to the following described variants of the substrate processing devices of the invention in combination with transfer modules 18".

It can also be advantageous, when further robots, for instance, to improve the substrate output respectively also for the substrate crack removal, are used in the carrier transport areas 9.

Figure 17:
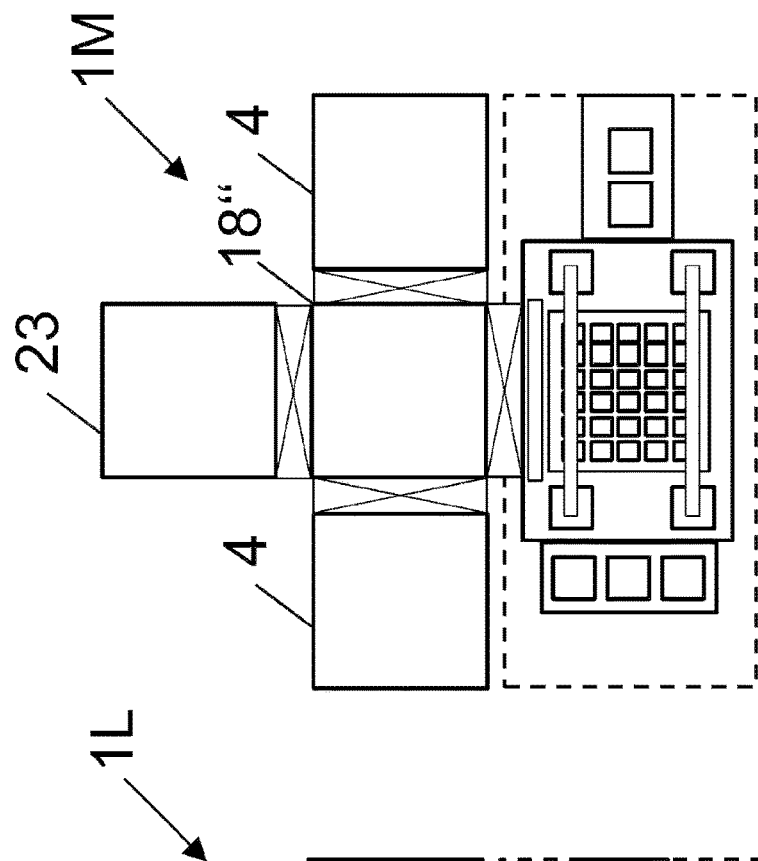
FIG. 17 schematically shows another substrate processing device of the invention in an embodiment as cluster substrate processing device in a top view.
Figure 16:
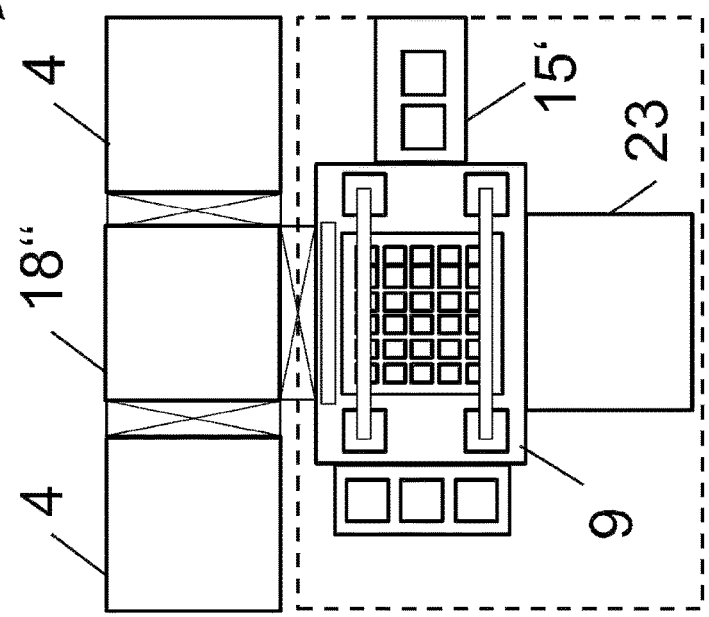
FIG. 16 schematically shows a further substrate processing device of the invention in an embodiment as cluster substrate processing device in a top view.

Further embodiments of substrate processing devices 1L and 1M of the invention are schematically shown in the FIGS. 16 and 17 in a top view. The substrate processing device 1L shows an embodiment, at which a carrier device store 23 is directly coupled with a carrier transport area 9. The substrate processing device 1M, however, shows the option to couple a carrier device store 23 to the transfer module 18".

Figure 18:
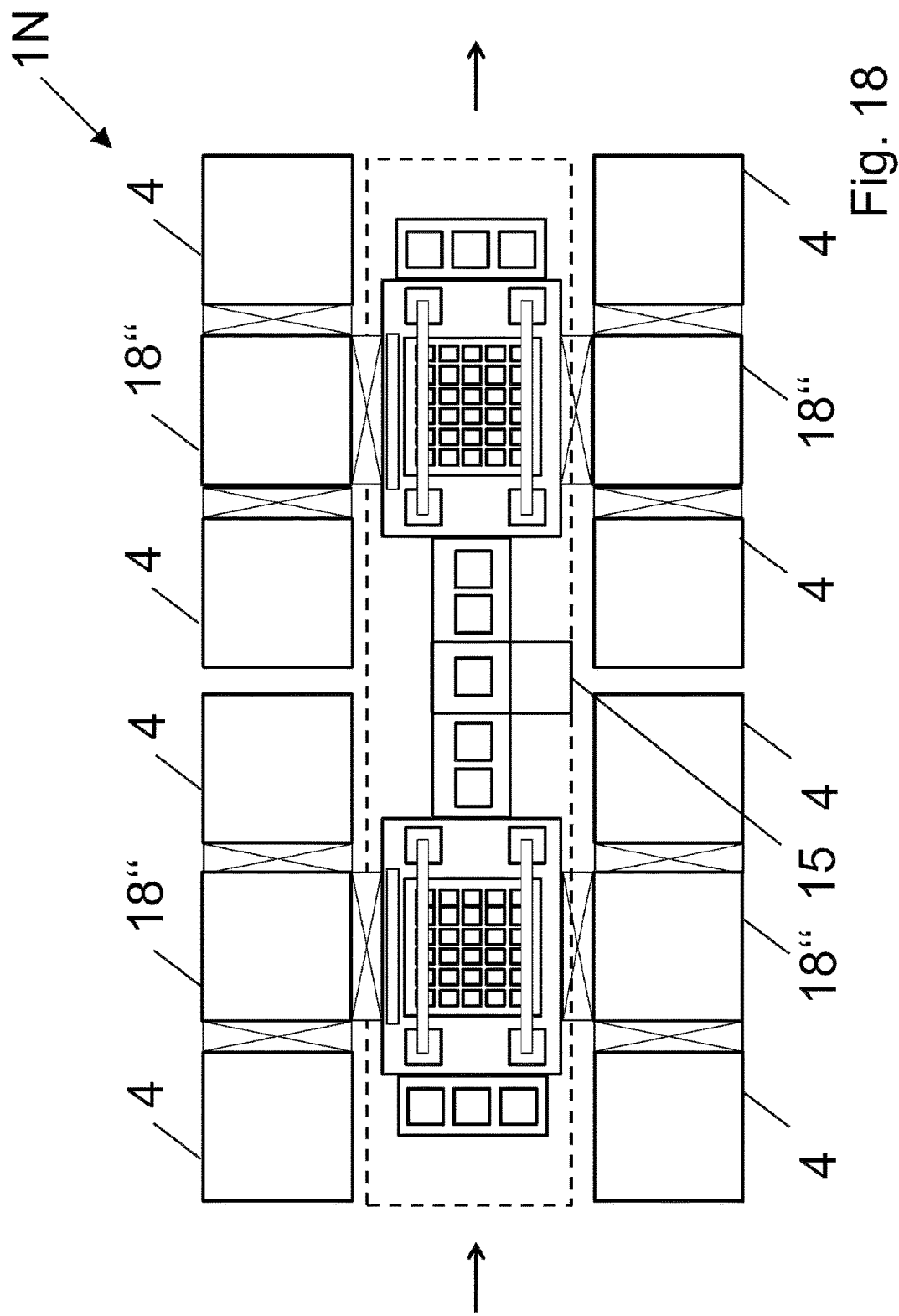
FIG. 18 schematically shows a variant of a substrate processing device of the invention with eight process modules in a top view.

FIG. 18 schematically shows another substrate processing device 1N of the invention in a top view. The substrate processing device 1N is an in-line device comprising a relatively narrow width transverse to the in-line direction of the substrates 3 through the substrate processing device 1N. The narrow width is accomplished by the arrangement of the process modules 4 at the transfer modules 18" in the direction of the substrate carrier column Y.

The illustrated embodiments show that the substrate processing devices 1, 1A to 1N of the invention can be provided in many different ways. Among the embodiments shown, other, not-illustrated embodiments or combinations of the embodiments shown are possible, which a person skilled in the art can provide on the basis of the description and his know-how.

The invention claimed is:

1. A substrate processing device, comprising:
at least one substrate loading and unloading area for loading and unloading the substrate processing device with substrates;
at least one evacuable process chamber;
at least one carrier transport device;
at least one carrier transport area, said at least one carrier transport device being transported through said at least one carrier transport area;
at least one carrier device, with which the substrates are transported by said at least one carrier transport device in said at least one carrier transport area to said at least one evacuable process chamber, wherein said at least one carrier device includes at least one substrate carrier line;
gas-tight closing devices including at least one first gas-tight closing device disposed between said at least one evacuable process chamber and said at least one carrier transport area and at least one second gas-tight closing device disposed between said at least one substrate loading and unloading area and said at least one carrier transport area;
at least one substrate cassette containing the substrates and disposed in said at least one substrate loading and unloading area;
at least one substrate transfer device; and
a substrate transfer area, said at least one substrate loading and unloading area being coupled with said at least one carrier transport area by said substrate transfer area with said at least one substrate transfer device transferring the substrates from said at least one substrate cassette, in which the substrates in different horizontal cassette levels of said at least one substrate cassette are disposed, onto said at least one carrier device, with which the substrates are held in a horizontal carrier level, wherein said substrate transfer area is closeable gas-tight against said at least one substrate loading and unloading area;
wherein said at least one substrate transfer device includes a transfer bridge extending parallel to said at least one substrate carrier line of said at least one carrier device and above said at least one carrier device;
wherein said substrate processing device further includes a process module in which said at least one evacuable process chamber is disposed;
wherein at least one of said at least one evacuable process chamber is physically closeable by said at least one carrier device against said process module; and
wherein said at least one carrier device forms a bottom of said at least one process chamber.

2. The substrate processing device according to claim 1, wherein said substrate transfer area is filled with an inert gas.

3. The substrate processing device according to claim 1, wherein said at least one substrate carrier line defines a plurality of substrate carrier lines, said at least one carrier device has substrate nests provided in a carrier level in said plurality of substrate carrier lines and in a plurality of substrate carrier columns, and said at least one carrier device is moveable in a direction of a substrate carrier line and/or in a direction of a substrate carrier column.

4. The substrate processing device according to claim 1, wherein said at least one carrier transport device has a roller transport system.

5. The substrate processing device according to claim 1, wherein said at least one substrate transfer device provides a substrate loading level above said at least one carrier transport area and parallel to said at least one carrier device, said at least one substrate transfer device equipping said at least one carrier device with substrates in a line-wise or column-wise manner.

6. The substrate processing device according to claim 1, wherein said at least one carrier device includes at least one substrate carrier column and said transfer bridge of said at least one carrier device is moveable along a substrate carrier column direction and/or along a substrate carrier line direction.

7. The substrate processing device according to claim 1, wherein said at least one substrate transfer device has at least one non-contact substrate handling device.

8. The substrate processing device according to claim 7, wherein said at least one non-contact substrate handling device is ultrasound-enhanced.

9. The substrate processing device according to claim 1, further comprising a lift system, said at least one substrate cassette is coupled to said lift system for a defined unload and return of a respective uppermost substrate by means of said at least one substrate transfer device.

10. The substrate processing device according to claim 1, wherein the substrate processing device has at least two carrier device levels, wherein said at least one carrier device is one of a plurality of carrier devices in the at least two carrier device levels that are independently moveable.

11. The substrate processing device according to claim 10, further comprising a carrier device lift disposed between at least two of the carrier device levels, and with which at least one of said carrier devices is brought to another carrier device level.

12. The substrate processing device according to claim 1, wherein said at least one evacuable process chamber is one of at least two process chambers stacked on top of each other and being coupled with said at least one carrier transport area.

13. The substrate processing device according to claim 1, wherein said at least one substrate loading and unloading area has a cassette store, in which said at least one substrate cassette is provided, and is coupled with said at least one substrate transfer device.

14. The substrate processing device according to claim 13, wherein said cassette store is evacuable and/or fillable with an inert gas.

15. The substrate processing device according to claim 1, wherein said at least one carrier transport area has at least one tempering device.

16. The substrate processing device according to claim 1, wherein said at least one carrier transport area is one of at least two carrier transport areas;
wherein said at least one carrier device is one of a plurality of carrier devices; and
a substrate transfer station disposed between said at least two carrier transport areas and configured for transferring the substrates from one of said carrier devices onto another of said carrier devices.

17. The substrate processing device according to claim 1, further comprising a substrate crack detection device and/or a substrate crack disposal device.

18. The substrate processing device according to claim 1, wherein said at least one evacuable process chamber is one of a plurality of process chambers; and
wherein at least one of said process chambers is physically closeable by said at least one carrier device.

19. The substrate processing device according to claim 18, wherein said at least one evacuable process chamber includes an RF-electrode provided as a gas shower, and said at least one carrier device forms an electrode disposed in parallel with said RF-electrode.

20. The substrate processing device according to claim 1, further comprising:
a transfer module; and
wherein between said process module and said at least one carrier transport area, said transfer module is disposed, and is closeable gas-tight against said process module and against said at least one carrier transport area.

21. The substrate processing device according to claim 20, wherein:
said at least one carrier device is one of a plurality of carrier devices; and
said transfer module provides at least two levels for said carrier devices.

22. The substrate processing device according to claim 1, wherein said at least one evacuable process chamber is one of a plurality of process chambers;
wherein said at least one carrier device is one of a plurality of carrier devices; and
further comprising at least two additional process modules each with at least one of said process chambers, wherein each of said at least two process modules contains one of said carrier devices.

23. The substrate processing device according to claim 22, wherein said at least one carrier transport area forms a separation area for said at least two process modules and an exchange area for the substrates on different ones of said carrier devices, respectively.

* * * * *